(12) United States Patent
Yun et al.

(10) Patent No.: US 7,388,243 B2
(45) Date of Patent: Jun. 17, 2008

(54) SELF-ALIGNED BURIED CONTACT PAIR

(75) Inventors: Cheol-Ju Yun, Seoul (KR);
Chang-Hyun Cho, Yongin (KR);
Tae-Young Chung, Yongin (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 79 days.

(21) Appl. No.: 11/430,036

(22) Filed: May 9, 2006

(65) Prior Publication Data
US 2006/0205147 A1 Sep. 14, 2006

Related U.S. Application Data

(62) Division of application No. 10/762,380, filed on Jan. 23, 2004, now Pat. No. 7,056,786.

(30) Foreign Application Priority Data
Sep. 1, 2003 (KR) .............................. 2003-60912

(51) Int. Cl.
*H01L 27/108* (2006.01)
(52) U.S. Cl. ...................... 257/298; 257/296; 257/308; 257/301
(58) Field of Classification Search ........ 257/296–291, 257/306–311
See application file for complete search history.

(56) References Cited

U.S. PATENT DOCUMENTS

| | | | |
|---|---|---|---|
| 6,168,987 B1 * | 1/2001 | Jeng et al. | ................... 438/253 |
| 6,177,320 B1 | 1/2001 | Cho et al. | |
| 6,339,239 B1 | 1/2002 | Alsmeier et al. | |
| 6,458,692 B1 * | 10/2002 | Kim | ........................... 438/639 |
| 6,461,911 B2 | 10/2002 | Ahn et al. | |
| 6,607,954 B2 | 8/2003 | Jeon et al. | |
| 2002/0135072 A1 | 9/2002 | Han et al. | |

* cited by examiner

*Primary Examiner*—Dung A. Le
(74) *Attorney, Agent, or Firm*—Lee & Morse, P.C.

(57) ABSTRACT

A self-aligned buried contact (BC) pair includes a substrate having diffusion regions; an oxide layer exposing a pair of diffusion regions formed on the substrate; bit lines formed between adjacent diffusion regions and on the oxide layer, each of the bit lines having bit line sidewall spacers formed on sidewalls thereof; a first interlayer dielectric (ILD) layer formed over the bit lines and the oxide layer; a pair of BC pads formed between adjacent bit lines and within the first ILD layer, each BC pad being aligned with one of the pair of exposed diffusion regions in the substrate; and a pair of capacitors, each of the pair of BC pads having one of the pair of capacitors formed thereon, wherein a pair of the bit line sidewall spacers is adjacent to each of the BC pads and the pair of bit line sidewall spacers has an asymmetrical shape.

15 Claims, 10 Drawing Sheets

SELF-ALIGNED BURIED CONTACT PAIR

CROSS-REFERENCE TO RELATED APPLICATION

This is a divisional application based on pending application Ser. No. 10/762,380, filed Jan. 23, 2004, now U.S. Pat. No. 7,056,786, the entire contents of which is hereby incorporated by reference.

BACKGROUND OF THE INVENTION

1. Field of the Invention

The present invention relates to self-aligned contacts and a method of forming the same. More particularly, the present invention relates to a self-aligned buried contact pair and a method of forming the same.

2. Description of the Related Art

Recently, a trend toward smaller design rules for semiconductor devices, such as gigabit dynamic random access memory (DRAM) devices, has advanced to such an extent that it is highly difficult to secure an alignment margin when aligning a buried contact with a bit line semiconductor layer or an interconnect layer underlying the buried contact. A misalignment of the buried contact and bit line causes a fail of the contact resistance.

Further, as a design rule decreases, a conventional lithography method is no longer acceptable. Specifically, when a design rule is greater than 0.11 µm, conventional lithography using a KrF light source having a wavelength of 248 nm is acceptable. When a design rule is less than 0.11 µm, however, lithography using an ArF light source having a wavelength of 193 nm must be used. Thus, as the design rule deceases, the wavelength of the light source used in the lithography process must decrease.

Significant differences exist between KrF and ArF lithography. For example, because the two different lithographic processes use different light sources, different photoresists must be used. The ArF lithography process requires a more sensitive photoresist that has a poor etching immunity. Accordingly, more ArF photoresist is consumed during an etching process and thus, an initial thickness of the ArF photoresist must be greater than what is used in connection with a KrF lithography. Resultantly, having to use ArF lithography is a costly consequence of the reduction of the design rule.

SUMMARY OF THE INVENTION

In an effort to overcome at least some of the problems described above, the present invention provides a self-aligned buried contact pair and a method of forming the same.

It is a feature of an embodiment of the present invention to provide a self-aligned buried contact pair, including a substrate having a plurality of diffusion regions, an oxide layer formed on the substrate, wherein the oxide layer exposes a pair of the plurality of diffusion regions in the substrate, a plurality of bit lines formed on the oxide layer, each of the plurality of bit lines being formed between adjacent diffusion regions in the substrate and each of the plurality of bit lines having bit line sidewall spacers formed on sidewalls thereof, a first interlayer dielectric (ILD) layer formed over the plurality of bit lines and the oxide layer, a pair of buried contact pads formed between adjacent bit lines and within the first ILD layer, each of the pair of buried contact pads being aligned with one of the pair of exposed diffusion regions in the substrate, and a pair of capacitors, each of the pair of buried contact pads having one of the pair of capacitors formed thereon, wherein a pair of the bit line sidewall spacers is adjacent to each of the buried contact pads and the pair of bit line sidewall spacers has an asymmetrical shape.

Preferably, each bit line includes a bit line barrier metal formed on the oxide layer, a WSi layer formed on the bit line barrier metal, and a bit line mask formed on the WSi layer. Also preferably, the pair of buried contact pads is formed of polysilicon or tungsten (W).

It is another feature of an embodiment of the present invention to provide a method of forming a self-aligned buried contact pair including depositing an oxide layer on a substrate having diffusion regions, forming a plurality of bit lines having bit line sidewall spacers on the oxide layer, forming a first interlayer dielectric (ILD) layer on the oxide layer, the plurality of bit lines and bit line sidewall spacers, etching the first ILD layer and the oxide layer to expose a pair of adjacent diffusion regions in the substrate simultaneously, forming a pair of buried contact pads on the exposed pair of adjacent diffusion regions in the substrate, and forming a capacitor on each of the pair of buried contact pads.

The oxide layer may be formed using a thermal oxidation process. The first ILD layer may be formed using a chemical vapor deposition (CVD) process.

The method may additional include planarizing the first ILD layer after depositing the first ILD layer. This planarizing may be performed using a chemical mechanical polishing (CMP) process.

Forming the pair of buried contact pads may include depositing a pad layer on the pair of exposed diffusion regions, and planarizing the pad layer and the first ILD layer to expose the plurality of bit lines. The pad layer may be deposited using a CVD process. Planarizing the pad layer and the first ILD layer may be performed using a CMP process.

It is a further feature of an embodiment of the present invention to provide a self-aligned buried contact pair including a substrate having a plurality of diffusion regions, a first interlayer dielectric (ILD) layer formed on the substrate, a plurality of first direct contact pads and first buried contact pads formed on the substrate within the first ILD layer, each one of the plurality of first direct contact pads and first buried contact pads being aligned with one of the plurality of diffusion regions, a second ILD layer formed on the plurality of first direct contact pads, first buried contact pads, and the first ILD layer, a plurality of second direct contact pads formed within the second ILD layer, each of the plurality of second direct contact pads being aligned with one of the first direct contact pads, a plurality of bit lines formed on the second ILD layer, each of the plurality of second direct contact pads having one of the plurality of bit lines formed thereon, and each of the plurality of bit lines having bit line sidewall spacers formed on sidewalls thereof, a third ILD layer formed on the second ILD layer and the plurality of bit lines, a plurality of second buried contact pads formed within the third ILD layer, each of the plurality of second buried contact pads being aligned with one of the first buried contact pads, and a plurality of capacitors, each of the plurality of second buried contact pads having one of the plurality of capacitors formed thereon, wherein a pair of the plurality of bit line sidewall spacers is adjacent to each of the second buried contact pads and the pair of bit line sidewall spacers has an asymmetrical shape.

The pair of second direct contact pads is formed of polysilicon or a metal, such as tungsten (W). The pair of second buried contact pads is formed of polysilicon or tungsten (W).

Each bit line preferably includes a bit line barrier metal formed on the second ILD layer, a WSi layer formed on the bit line barrier metal, and a bit line mask formed on the WSi layer.

It is still another feature of an embodiment of the present invention to provide a method of forming a self-aligned buried contact pair including depositing a first interlayer dielectric (ILD) layer on a substrate having diffusion regions, forming first direct contact pads and first buried contact pads in the first ILD layer, each one of the first direct contact pads and first buried contact pads being aligned over one of the diffusion regions of the substrate, forming a second ILD layer on the first ILD layer, the direct contact pads and the first buried contact pads, forming second direct contact pads in the second ILD layer, each one of the second direct contact pads being aligned over one of the first direct contact pads, forming a plurality of bit lines including bit line sidewall spacers on the second ILD layer, forming a third ILD layer on the second ILD layer, the plurality of bit lines and bit line sidewall spacers, etching the third ILD layer and the second ILD layer to expose a pair of adjacent first buried contact pads simultaneously, forming second buried contact pads on the exposed pair of adjacent first buried contact pads, and forming a capacitor on each of the second buried contact pads.

Any of the first, second, or third ILD layers may be formed using a CVD process.

Forming the first buried contact pads and first direct contact pads may include patterning the first ILD layer, etching the first ILD layer, depositing a first pad layer over the etched first ILD layer, and planarizing the first buried contact pads, the first direct contact pads, and the first ILD layer.

Planarizing the first buried contact pads, the first direct contact pads, and the first ILD layer may be performed using either a CMP or an etch-back process.

Forming the second direct contact pads may include etching the second ILD layer, depositing a conductive layer over the etched second ILD layer, and planarizing the conductive layer to expose the second ILD layer so that the conductive layer material only remains in the etched portion of the second ILD layer. Preferably, the conductive layer is deposited using a CVD process and is planarized using a CMP process.

Each of the plurality of bit lines may include a bit line barrier metal formed on the second ILD layer, a WSi layer formed on the bit line barrier metal, and a bit line mask formed on the WSi layer.

The method may further include planarizing the third ILD layer after depositing the third ILD layer. Preferably, the third ILD layer is planarized using a CMP process.

Forming the second buried contact pads may include depositing a third pad layer on the exposed pair of adjacent first buried contact pads, and planarizing the third pad layer and the third ILD layer to expose the plurality of bit lines. Preferably, the third pad layer is deposited using a CVD process and is planarized using a CMP process.

It is still yet another feature of an embodiment of the present invention to provide a self-aligned buried contact pair including a substrate having a pair of diffusion regions, a first interlayer dielectric (ILD) layer formed on the substrate, a pair of first buried contact pads formed on the substrate within the first ILD layer, each one of the pair of first buried contact pads being aligned with one of the pair of diffusion regions, a second ILD layer formed on the pair of first buried contact pads and the first ILD layer, a plurality of bit lines formed on the second ILD layer, each of the plurality of bit lines having bit line sidewall spacers formed on sidewalls thereof, a third ILD layer formed on the second ILD layer, the plurality of bit lines, and the bit lines sidewall spacers, a pair of second buried contact pads, each one of the pair of second buried contact pads being formed on one of the first buried contact pads and extending through the second and third ILD layers, and a pair of capacitors, each of the pair of second buried contact pads having one of the pair of capacitors formed thereon, wherein a pair of the plurality of bit line sidewall spacers is adjacent to each of the second buried contact pads and the pair of bit line sidewall spacers has an asymmetrical shape.

Preferably, the pair of second buried contact pads is formed of polysilicon or tungsten (W).

Each bit line may include a bit line barrier metal formed on the second ILD layer, a WSi layer formed on the bit line barrier metal, and a bit line mask formed on the WSi layer.

It is a still further feature of an embodiment of the present invention to provide a method of forming a self-aligned buried contact pair including depositing a first interlayer dielectric (ILD) layer on a substrate having a pair of diffusion regions, forming a pair of first buried contact pads in the first ILD layer, each one of the pair of first buried contact pads being aligned over one of the pair of diffusion regions in the substrate, forming a second ILD layer on the first ILD layer and the first buried contact pads, forming a plurality of bit lines having bit line sidewall spacers on the second ILD layer, forming a third ILD layer on the second ILD layer, the plurality of bit lines and bit line sidewall spacers, etching the third ILD layer and the second ILD layer to expose the pair of first buried contact pads simultaneously, forming second buried contact pads on the exposed pair of adjacent first buried contact pads, and forming a capacitor on each of the second buried contact pads.

Any of the first, second, or third ILD layers may be formed using a CVD process.

The method may further include planarizing the third ILD layer after depositing the third ILD layer. Preferably, the third ILD layer is planarized using a CMP process.

Forming the first buried contact pads may include patterning the first ILD layer, etching the first ILD layer, depositing a first pad layer over the first ILD layer, and planarizing the first pad layer to expose the first ILD layer so that the first pad layer only remains in the etched portion of the first ILD layer.

The first pad layer may be planarized using a CMP process or an etch-back process.

Forming the second BC pads may include depositing a second pad layer on the exposed pair of adjacent first buried contact pads, and planarizing the second pad layer and the third ILD layer to expose the plurality of bit lines.

The second pad layer may be deposited using a CVD process and may be planarized using a CMP process.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
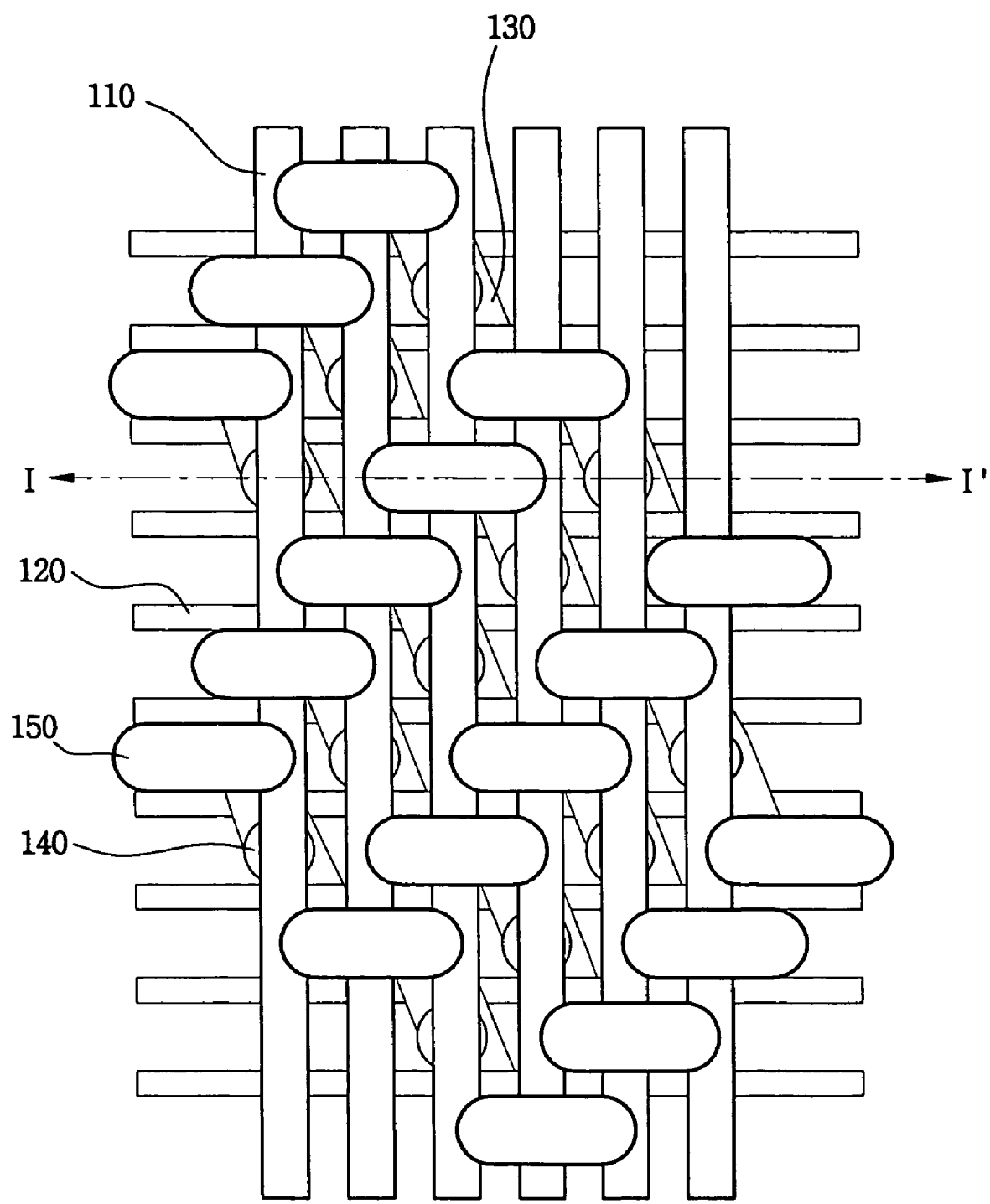
FIG. 1 illustrates a plan view of a cell layout of a DRAM device according to the various embodiments of the present invention.

The present invention will now be described more fully hereinafter with reference to the accompanying drawings, in which preferred and alternate embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals and characters refer to like elements throughout.

FIG. 1 illustrates a plan view of a cell layout of a DRAM device according to the various embodiments of the present invention.

Referring to FIG. 1, a plurality of bit lines 110 are formed over a plurality of perpendicular word lines 120. A plurality of diagonal active areas 130 (or diagonal active cells) is formed to encompass a plurality of direct contact self-aligned contacts (SAC) 140, which are formed between adjacent word lines. According to the various embodiments of the present invention, two adjacent buried contact self-aligned contacts are exposed within a single pattern opening 150 within a photoresist pattern.

Preferred First Embodiment

FIGS. 2A through 2F illustrate cross-sectional views, taken along line I-I' of FIG. 1, for explaining stages in a method of forming a self-aligned buried contact pair according to a preferred first embodiment of the present invention.

Figure 2A:
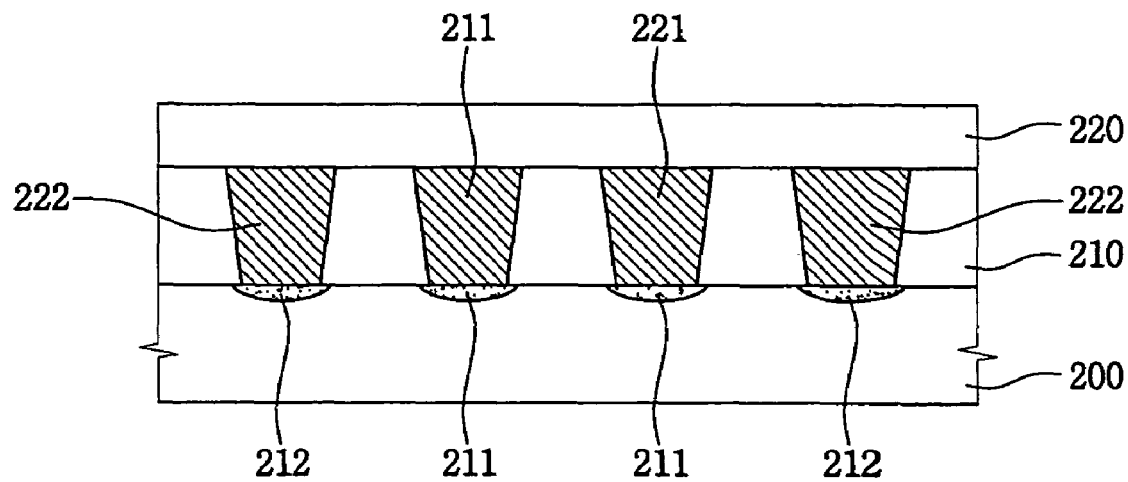
FIGS. 2A through 2F illustrate cross-sectional views, taken along line I-I' of FIG. 1, for explaining stages in a method of forming a self-aligned buried contact pair according to a preferred first embodiment of the present invention.

Referring to FIG. 2A, a substrate 200 includes a plurality of diffusion regions 211 and 212, i.e., source/drain regions. The diffusion regions 211 and 212 may be formed by ion implantation process. A first interlayer dielectric (ILD) layer 210 is formed over the substrate 200 and the diffusion regions 211 and 212. The first ILD layer 210 may be formed using a chemical vapor deposition (CVD) process.

The first ILD layer 210 is patterned and etched and then a first pad layer is deposited over the first ILD layer 210 to form a pair of first buried contact pads 221 and a pair of first direct contact pads 222 over the substrate 200 and the diffusion regions 211 and 212. Each one of the pair of first buried contact pads 221 and first direct contact pads 222 is aligned with one of the diffusions regions 211 and 212, respectively. The first pad layer may be a polysilicon layer and may be formed using a CVD process. The first buried contact pads 221, the first direct contact pads 222, and the first ILD layer 210 are then planarized using a chemical mechanical polishing (CMP) process or an etch-back process. A second ILD layer 220 is then formed on the planarized first buried contact pads 221, first direct contact pads 222, and first ILD layer 210. The second ILD layer 220 may be formed using a CVD process.

Figure 2B:
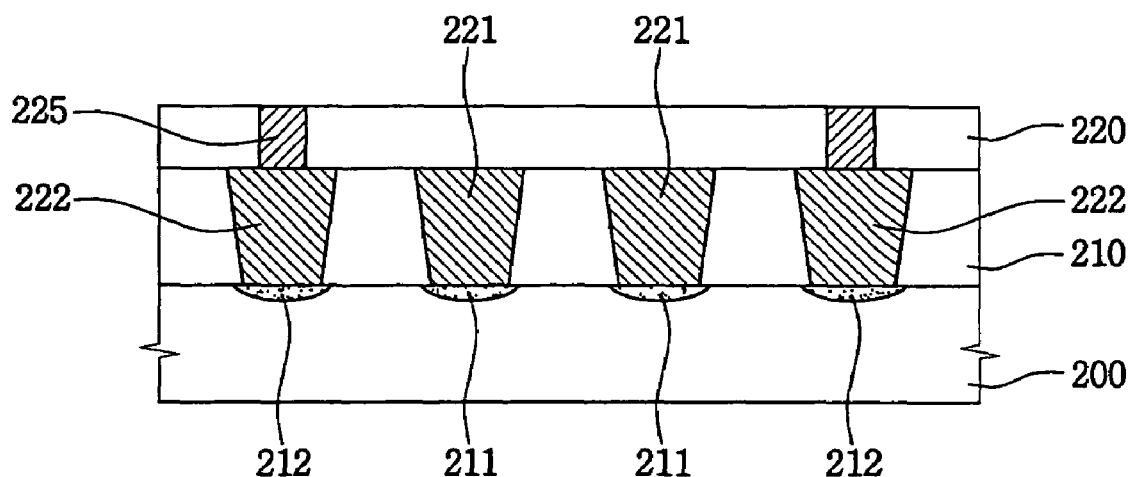

Referring to FIG. 2B, a pair of second direct contact pads 225 is formed in the second ILD layer 220. The second direct contact pads 225 are formed by etching the second ILD layer 220, depositing a conductive layer, i.e., a second pad layer, over the etched second ILD layer 220, and then planarizing the conductive layer to expose the second ILD layer 220 so that the conductive layer material only remains in the etched portion of the second ILD layer 220, thereby forming the second direct contact pads 225. Each of the pair of second direct contact pads 225 is aligned with one of the pair of first direct contact pads 222. The conductive layer may be a polysilicon layer and may be deposited using a CVD process. The second direct contact pads 225 are planarized using a CMP process.

Figure 2C:
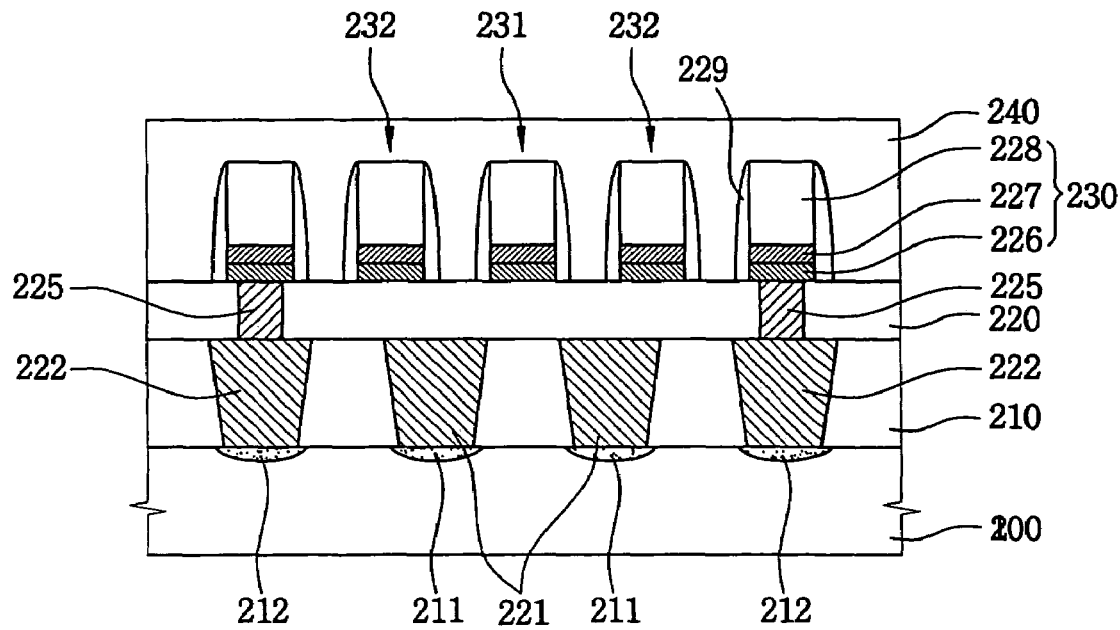

Referring to FIG. 2C, a plurality of bit lines 230 is formed on the second ILD layer 220. When a buried contact SAC area is formed, as will be subsequently described, the plurality of bit lines will include a central bit line 231 and peripheral bit lines 232. Each of the bit lines 230 includes a bit line barrier metal 226, a WSi layer 227, a bit line mask 228, and bit line sidewall spacers 229. The bit line barrier metal 226, the WSi layer 227, and the bit line mask 228 are sequentially stacked on the second ILD layer 220. The bit line sidewall spacers 229 are formed on sidewalls of the stack of the bit line barrier metal 226, the WSi layer 227, and the bit line mask 228. Each of the second direct contact pads 225 has a bit line 230 formed thereon. A third ILD layer 240 is then formed on the second ILD layer 220, the plurality of bit lines 230, and the bit line sidewall spacers 229. The third ILD layer 240 may be formed using a CVD process. The third ILD layer 240 is then planarized using a CMP process.

Figure 2D:
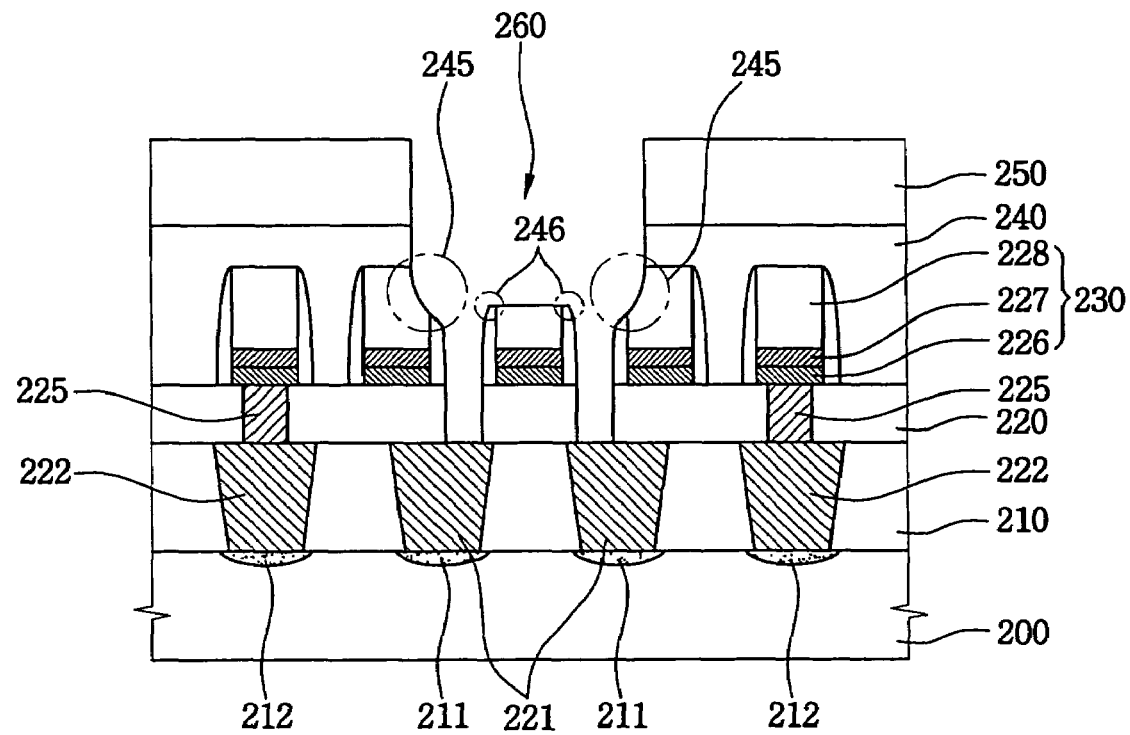

Referring to FIG. 2D, a photoresist pattern 250 is formed over the third ILD layer 240. Using the photoresist pattern 250 as a mask, the third ILD layer 240 and the second ILD layer 220 are sequentially etched to expose a pair of adjacent first buried contact pads 221 simultaneously, thereby forming a buried contact SAC area 260 aligned over a pair of adjacent first buried contact pads 221. The buried contact SAC area 260 defines the central bit line 231 and peripheral bit lines 232.

As a result of the etching process to form the buried contact SAC area 260, a pair of first shoulders 245 and a pair of second shoulders 246 are formed on upper portions of the bit line sidewall spacers 229. The pair of first shoulders 245 is separately formed on the peripheral bit lines 232. The pair of second shoulders 246 is formed on the central bit line 231. Thus, each of the openings exposing one of the first buried contact pads 221 is surrounded by a pair of shoulders. More specifically, each of the openings exposing one of the first buried contact pads 221 has one of the first shoulders 245 and one of the second shoulders 246 adjacent to the opening. As a result of the etching that simultaneously exposes a pair of first buried contact pads 221, the pair of first shoulders 245 and the pair of second shoulders 246 have an asymmetrical shape.

Figure 2E:
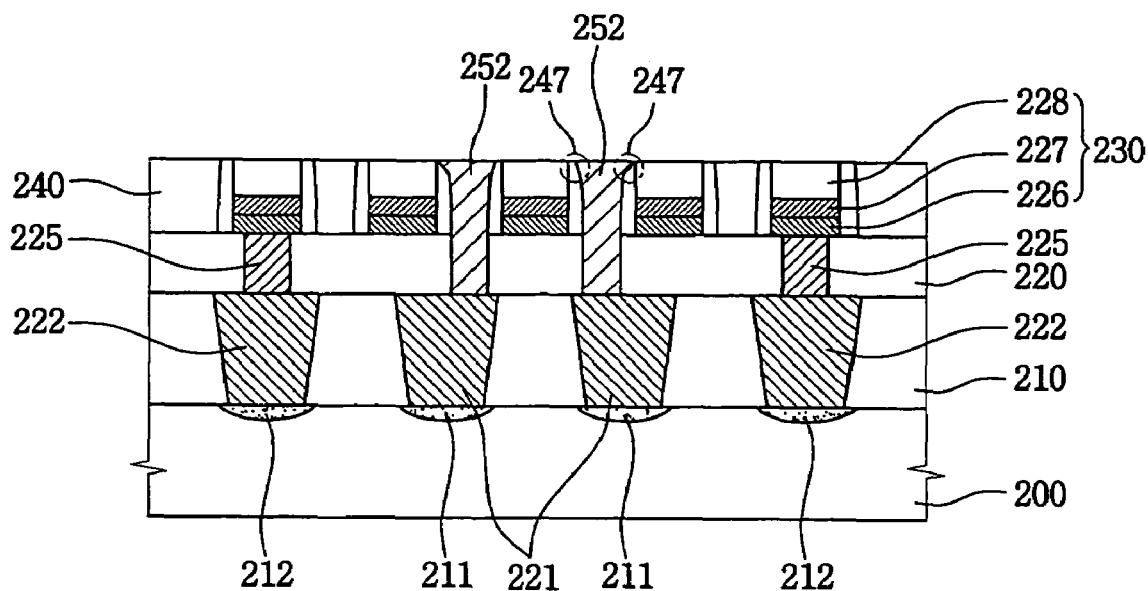

Referring to FIG. 2E, the photoresist pattern 250 is removed using a photoresist stripping process. To form a pair of second buried contact pads 252, a third pad layer is deposited on the pair of first buried contact pads 221 to fill the buried contact SAC area 260. The third pad layer may be a polysilicon layer and may be deposited using a CVD process. The third pad layer and the third ILD layer 240 are then planarized using a CMP process to expose the plurality of bit lines 230, thereby forming a pair of second buried contact pads 252. After the planarization process, a height of each of the plurality of bit lines 230 is the same, however, a pair of shoulders 247 that surrounds each of the second buried contact pads 252 has an asymmetrical shape. Preferably, the pair of second direct contact pads 225 is formed of polysilicon, although a metal, such as tungsten (W), may also be used. Preferably, the pair of second buried contact pads 252 is formed of polysilicon, although a metal, such as tungsten (W), may also be used.

Figure 2F:
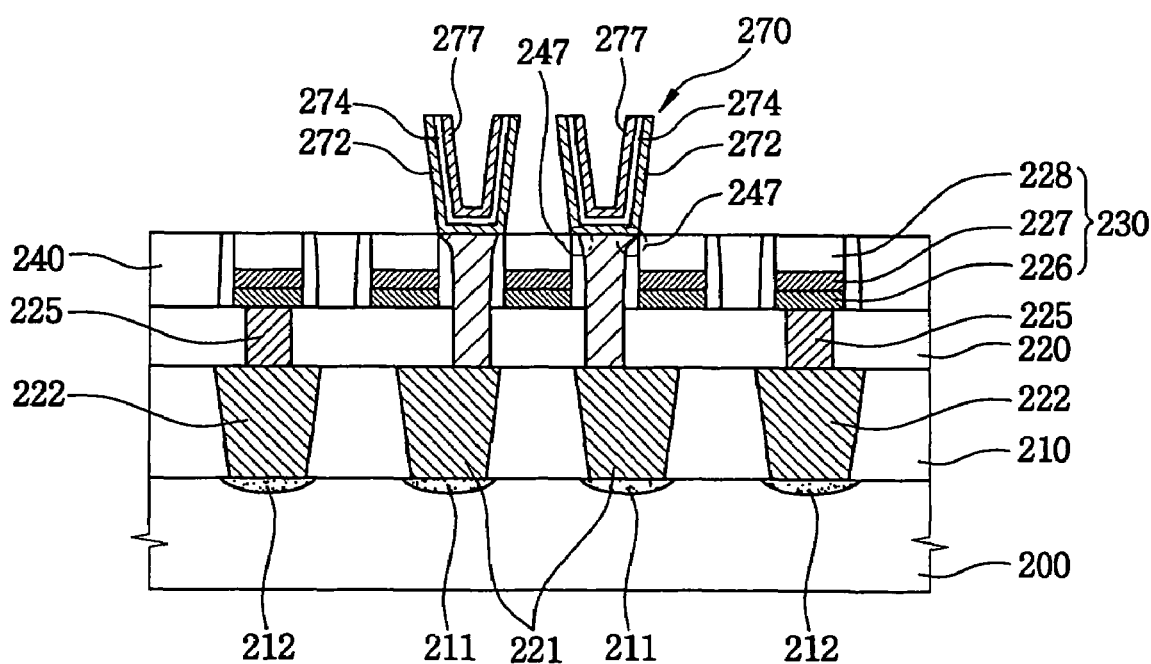

Referring to FIG. 2F, a capacitor 270 is formed on each of the second BC pads 252. Each capacitor includes a first plate 272, a capacitor insulator 274, and a second plate 277 and may be formed using a conventional process.

Second Embodiment

FIGS. 3A through 3E illustrate cross-sectional views, taken along line I-I' of FIG. 1, for explaining stages in a method of forming a self-aligned buried contact pair according to the second embodiment of the present invention.

Figure 3A:
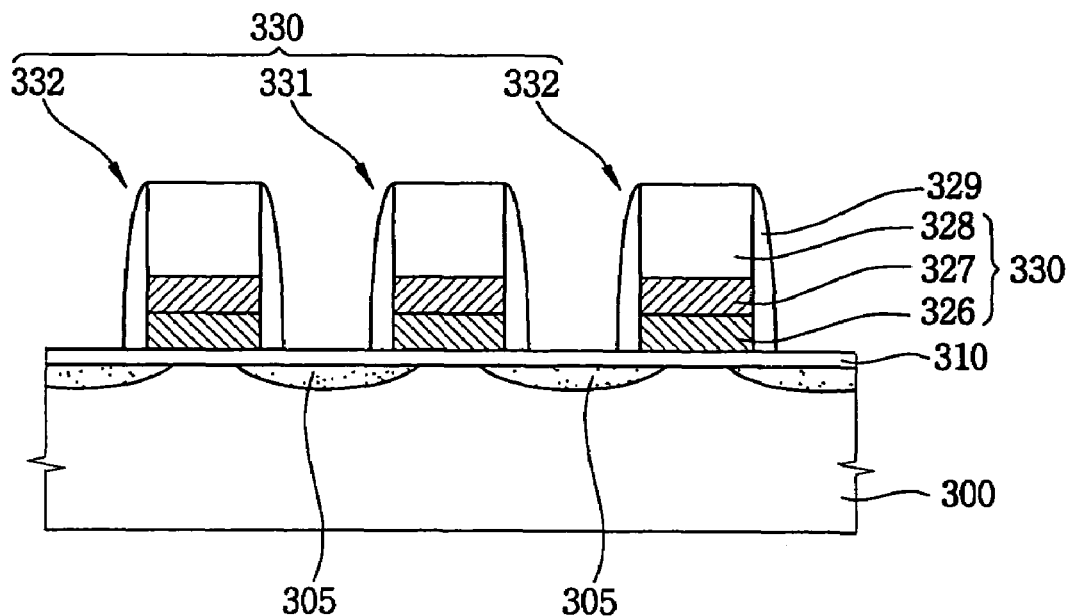
FIGS. 3A through 3E illustrate cross-sectional views, taken along line I-I' of FIG. 1, for explaining stages in a method of forming a self-aligned buried contact pair according to a second embodiment of the present invention.

Referring to FIG. 3A, a substrate 300 includes a plurality of diffusion regions 305, i.e., source/drain regions. The plurality of diffusion regions 305 is formed using an ion implantation process. An oxide layer 310 is formed over the substrate 300 and the diffusion regions 305. The oxide layer 310 is preferably formed using a thermal oxidation process. A plurality of bit lines 330 is then formed on the oxide layer 310. The plurality of bit lines 330 includes a central bit line 331 and peripheral bit lines 332. Each one of the plurality of bit lines 330 is formed between adjacent diffusion regions 305.

Each bit line 330 includes a bit line barrier metal 326, a WSi layer 327, a bit line mask 328, and bit line sidewall spacers 329. The bit line barrier metal 326, the WSi layer 327, and the bit line mask 328 are sequentially stacked on the oxide layer 310. Preferably, the bit line barrier metal 326, the WSi layer 327, and the bit line mask layer 328 are formed using a low-pressure chemical vapor deposition (LPCVD) process. The plurality of bit lines 330 is formed using a lithography and etching process. The bit line sidewall spacers 329 are formed on sidewalls of the stack of the bit line barrier metal 326, the WSi layer 327, and the bit line mask 328.

Figure 3B:
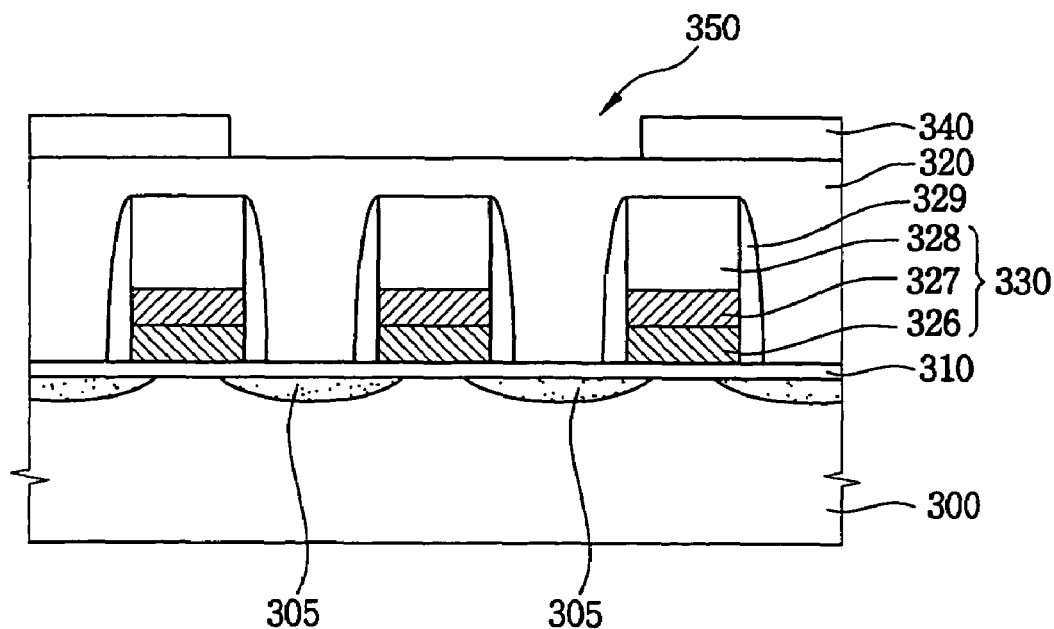

Referring to FIG. 3B, a first ILD layer 320 is deposited on the oxide layer 310, the bit lines 330, the bit line sidewall spacers 329, and the pair of exposed diffusion regions 305. The first ILD layer 320 may be deposited using a CVD process. The first ILD layer 320 is then planarized using a CMP process. A photoresist pattern 340 is then formed over the first ILD layer 320. An open region 350 is aligned over the central bit line 331 and the pair of diffusion regions 305, each of which are between the central bit line 331 and one of the peripheral bit lines 332.

Figure 3C:
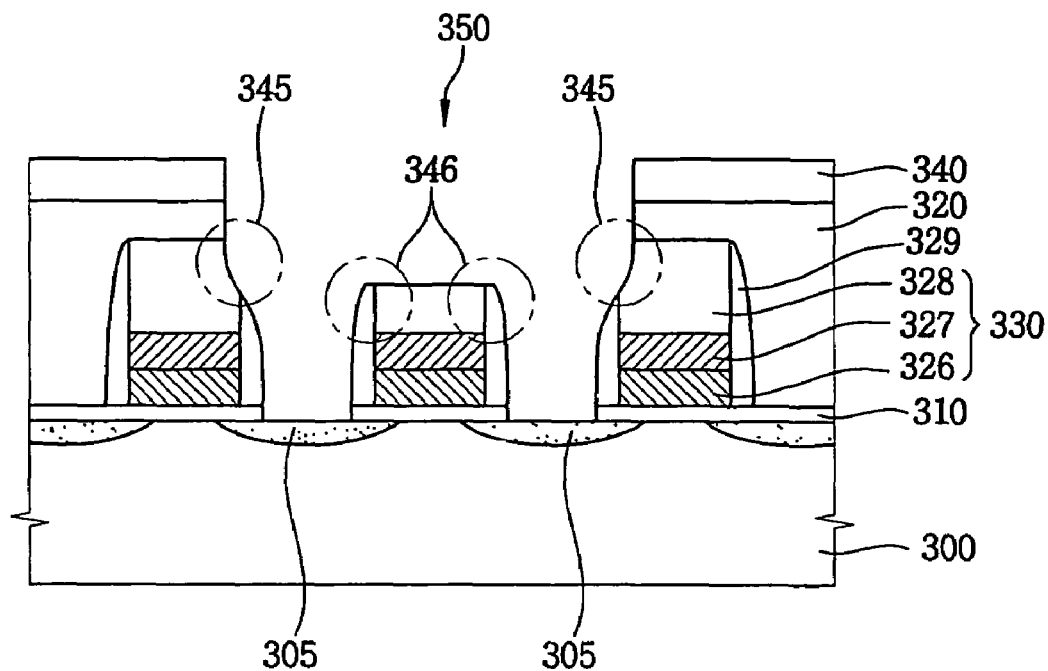

Referring to FIG. 3C, using the photoresist pattern 340 as a mask, the first ILD layer 320 is etched to expose the pair of adjacent diffusion regions 305 surrounding the central bit line 331, thereby forming a buried contact SAC area 350. The buried contact SAC area 350 defines the central bit line 331 and peripheral bit lines 332.

As a result of the etching process to form the buried contact SAC area 350, a pair of first shoulders 345 and a pair of second shoulders 346 are formed on upper portions of the bit line sidewall spacers 329. The pair of first shoulders 345 is separately formed on the peripheral bit lines 332. The pair of second shoulders 346 is formed on the central bit line 331. Thus, each of the openings exposing one of the exposed diffusion regions 305 is surrounded by a pair of shoulders. More specifically, each of the openings exposing one of the exposed diffusion regions 305 has one of the first shoulders 345 and one of the second shoulders 346 adjacent to the opening. As a result of the etching that simultaneously exposes a pair of diffusion regions 305, the pair of first shoulders 345 and the pair of second shoulders 346 have an asymmetrical shape.

Figure 3D:
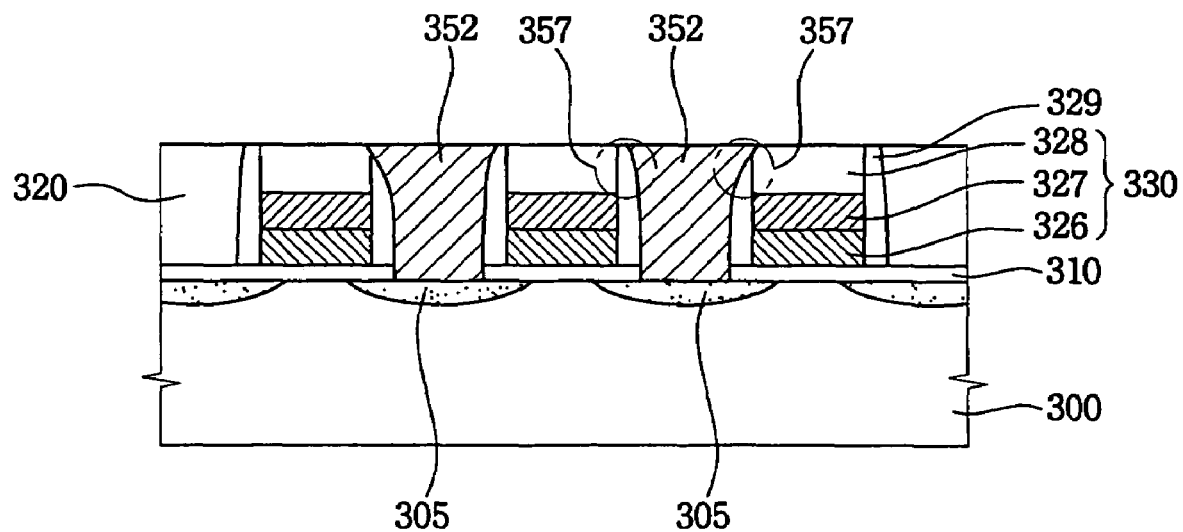

Referring to FIG. 3D, the photoresist pattern 340 is removed using a photoresist stripping process and the first ILD layer 320 is planarized using a CMP process. To form a pair of buried contact pads 352, a pad layer is deposited on the pair of exposed diffusion regions 305 to fill the BC SAC area 350. The pad layer may be a polysilicon layer and may be deposited using a CVD process. The pad layer and the first ILD layer 320 are then planarized to expose the plurality of bit lines 330, thereby forming a pair of buried contact pads 352. The pad layer and the first ILD layer 320 may be planarized using a CMP process.

After the planarization process, a height of each of the plurality of bit lines 330 is the same, however, a pair of shoulders 357 that surrounds each of the buried contact pads 352 has an asymmetrical shape. Preferably, the pair of buried contact pads 352 is formed of polysilicon, although a metal, such as tungsten (W), may also be used.

Figure 3E:
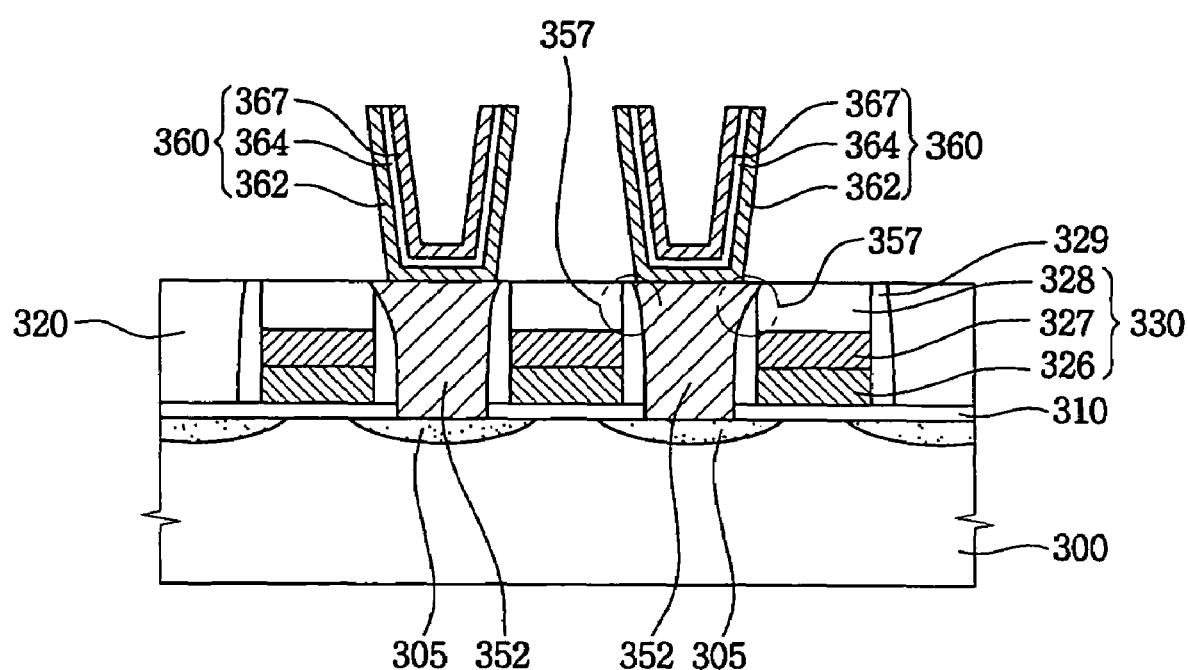

Referring to FIG. 3E, a capacitor 360 is formed on each of the buried contact pads 352. Each capacitor includes a first plate 362, a capacitor insulator 364, and a second plate 367 and may be formed using a conventional process.

Third Embodiment

FIGS. 4A through 4F illustrate cross-sectional views, taken along line I-I' of FIG. 1, for explaining stages in a method of forming a self-aligned buried contact pair according to a third embodiment of the present invention.

Figure 4A:
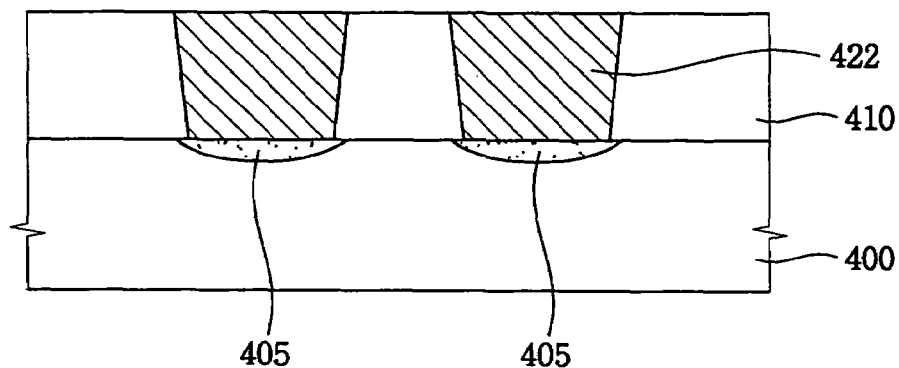
FIGS. 4A through 4F illustrate cross-sectional views, taken along line I-I' of FIG. 1, of stages in a method of forming a self-aligned buried contact pair according to a third embodiment of the present invention.

Referring to FIG. 4A, a substrate 400 includes a pair of diffusion regions 405, i.e., source/drain regions. The diffusion regions 405 may be formed using an ion implantation process. A first interlayer dielectric (ILD) layer 410 is formed over the substrate 400 and the diffusion regions 405. The first ILD layer 410 may be formed using a CVD process.

The first ILD layer 410 is patterned and etched and then a first pad layer is deposited over the first ILD layer 410 to form a pair of first buried contact pads 422 over the substrate 400 and the diffusion regions 405. Each one of the pair of first buried contact pads 422 is aligned with one of the diffusions regions 405. The first buried contact pads 422 and the first ILD layer 410 are then planarized using a CMP process or an etch-back process.

Figure 4B:
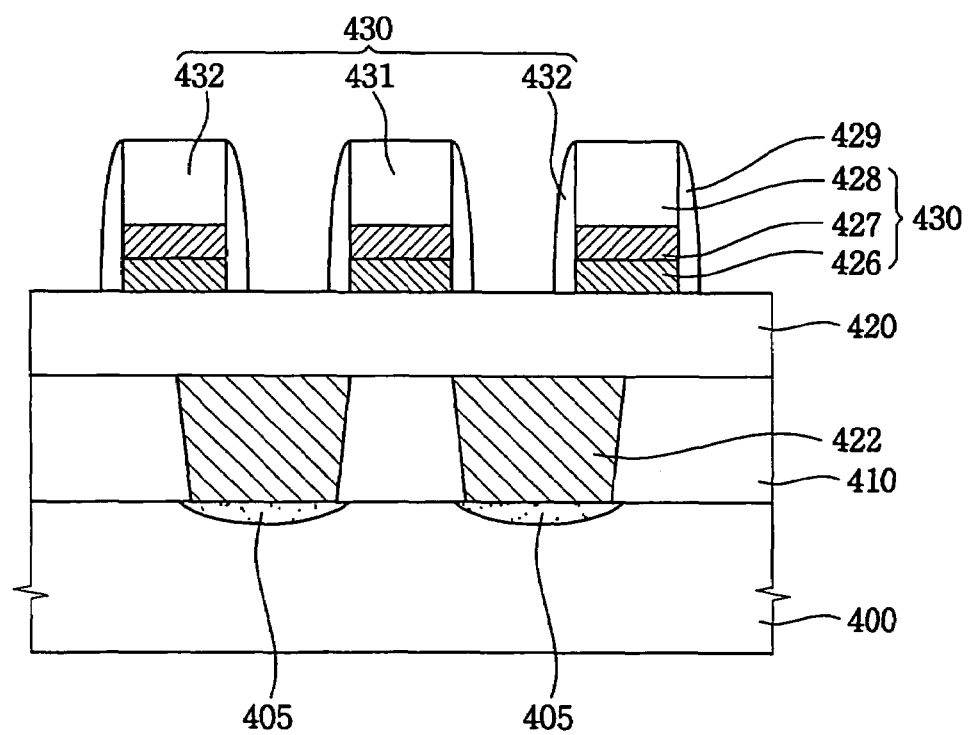

Referring to FIG. 4B, a second ILD layer 420 is then formed, preferably using a CVD process, on the planarized first buried contact pads 422 and first ILD layer 410. The second ILD layer 420 may be formed using a CVD process. A plurality of bit lines 430 is formed on the second ILD layer 420. The plurality of bit lines 430 includes a central bit line 431 and peripheral bit lines 432. Each of the bit lines 430 includes a bit line barrier metal 426, a WSi layer 427, a bit line mask 428, and bit line sidewall spacers 429. The bit line barrier metal 426, the WSi layer 427, and the bit line mask 428 are sequentially stacked on the second ILD layer 420.

The bit line sidewall spacers 429 are formed on sidewalls of the stack of the bit line barrier metal 426, the WSi layer 427, and the bit line mask 428.

Figure 4C:
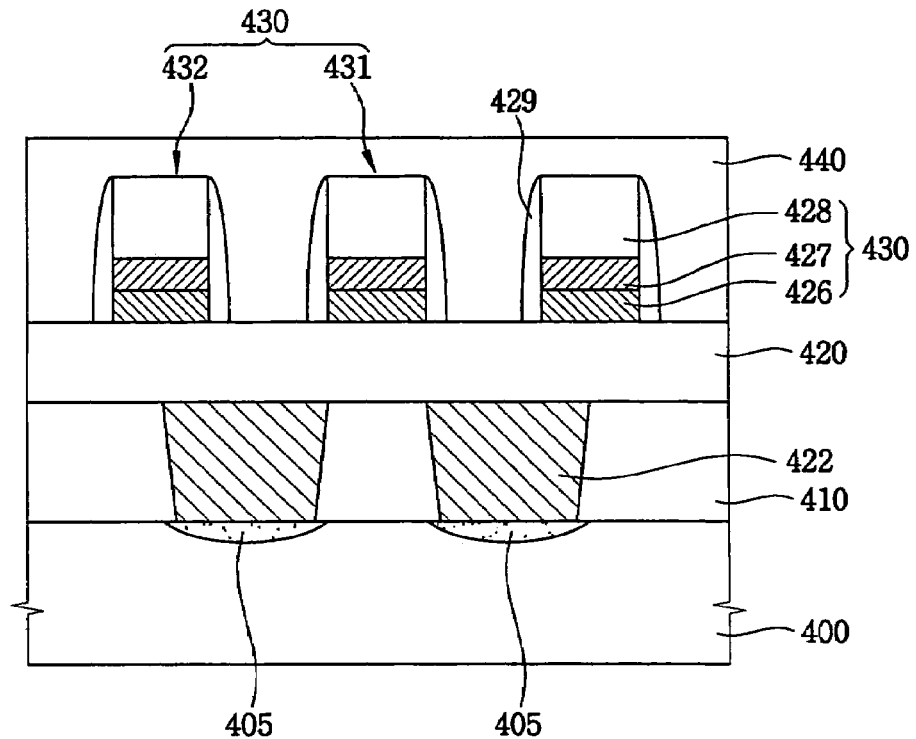

Referring to FIG. 4C, a third ILD layer 440 is then formed on the second ILD layer 420, the plurality of bit lines 430, and the bit line sidewall spacers 429. The third ILD layer 440 may be formed using a CVD process. The third ILD layer 440 is then planarized using a CMP process.

Figure 4D:
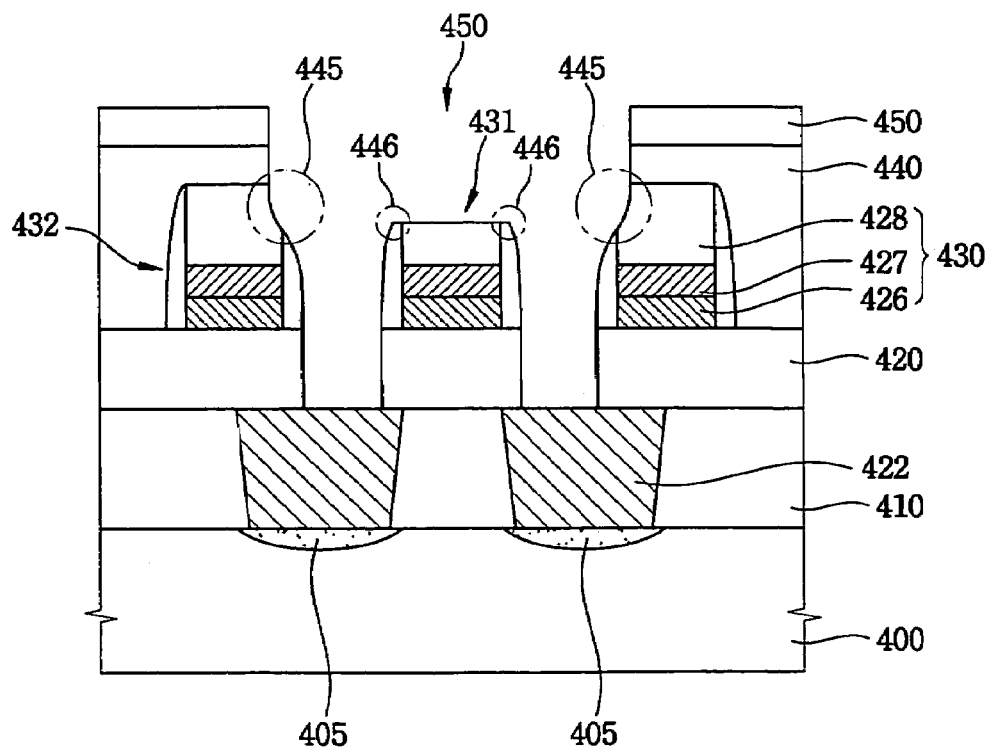

Referring to FIG. 4D, a photoresist pattern 450 is formed over the third ILD layer 440. Using the photoresist pattern 450 as a mask, the third ILD layer 440 and the second ILD layer 420 are sequentially etched to expose a pair of adjacent first buried contact pads 422 simultaneously, thereby forming a buried contact SAC area 450 aligned over a pair of adjacent first buried contact pads 422. The buried contact SAC area 450 defines the central bit line 431 and peripheral bit lines 432.

As a result of the etching process to form the buried contact SAC area 450, a pair of first shoulders 445 and a pair of second shoulders 446 are formed on upper portions of the bit line sidewall spacers 429. The pair of first shoulders 445 is separately formed on the peripheral bit lines 432. The pair of second shoulders 446 is formed on the central bit line 431. Thus, each of the openings exposing one of the first buried contact pads 422 is surrounded by a pair of shoulders. More specifically, each of the openings exposing one of the first buried contact pads 422 has one of the first shoulders 445 and one of the second shoulders 446 adjacent to the opening. As a result of the etching that simultaneously exposes a pair of first buried contact pads 422, the pair of first shoulders 445 and the pair of second shoulders 446 have an asymmetrical shape.

Figure 4E:
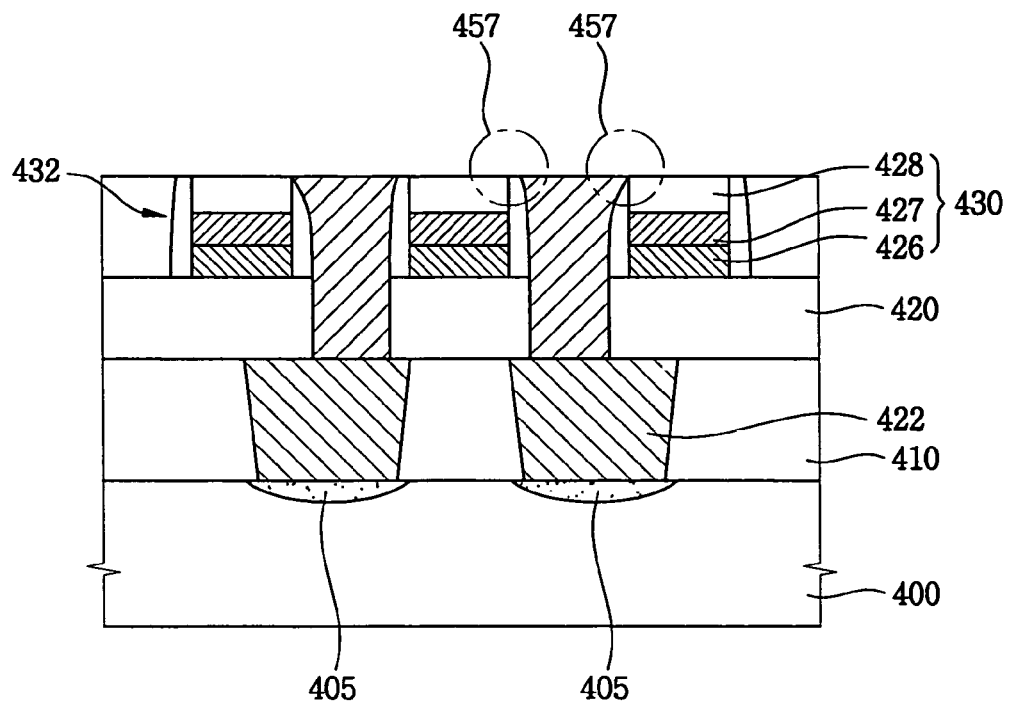

Referring to FIG. 4E, the photoresist pattern 450 is removed using a photoresist stripping process. To form a pair of second buried contact pads 452, a second pad layer is deposited on the pair of first buried contact pads 422 to fill the buried contact SAC area 450. The second pad layer may be deposited using a CVD process. The second pad layer and the third ILD layer 440 are then planarized using a CMP process to expose the plurality of bit lines 430, thereby forming a pair of second buried contact pads 452. After the planarization process, a height of each of the plurality of bit lines 430 is the same, however, a pair of shoulders 457 that surrounds each of the second buried contact pads 452 has an asymmetrical shape. Preferably, the pair of second buried contact pads 452 is formed of polysilicon, although a metal, such as tungsten (W), may also be used.

Figure 4F:
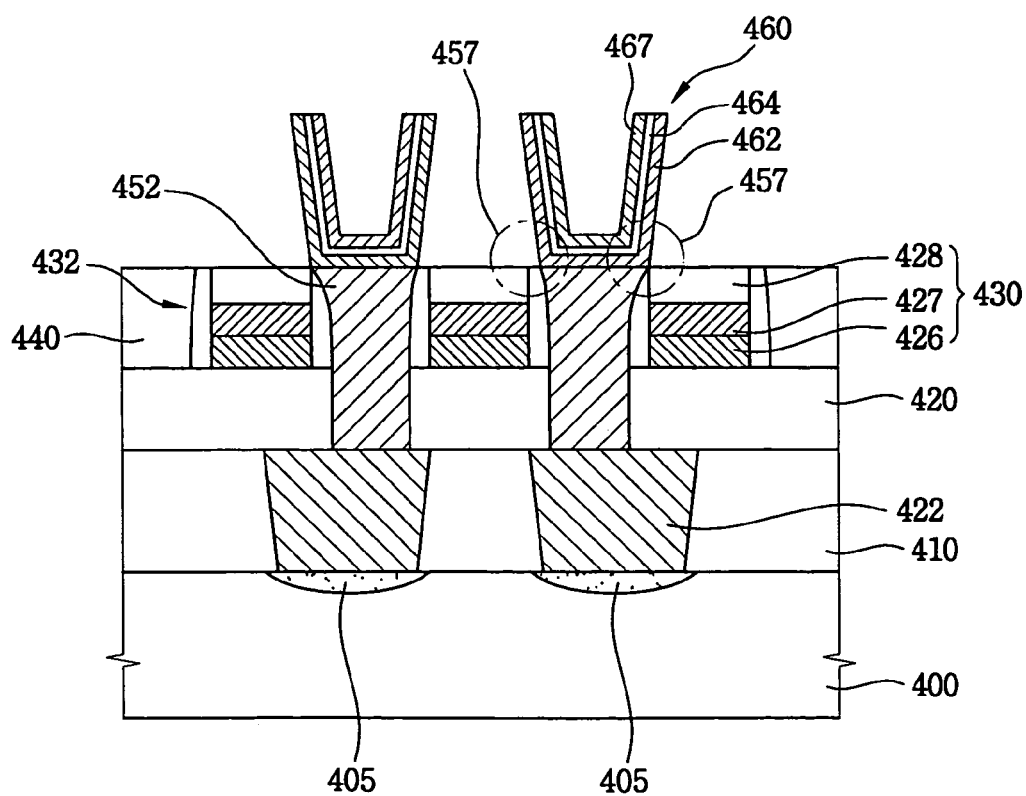

Referring to FIG. 4F, a capacitor 460 is formed on each of the second buried contact pads 452. Each capacitor includes a first plate 462, a capacitor insulator 464, and a second plate 467 and may be formed using a conventional process.

An advantage of etching to form a pair of buried contact pads simultaneously, as described above, is an improved buried contact aspect ratio, which lowers a buried contact resistance, as compared to a conventional process for exposing a single contact. A further advantage of the present invention is that the larger area of a pair of contacts, as compared to a single contact, permits the use of a less expensive KrF lithography process, as compared to an ArF lithography process. Yet another advantage of the present invention is that a misalign margin is improved between adjacent bit lines.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A self-aligned buried contact pair, comprising:
    a substrate having a plurality of diffusion regions;
    a lower layer on the substrate, the lower layer exposing a pair of the plurality of diffusion regions in the substrate;
    a plurality of bit lines on the lower layer, each of the plurality of bit lines being formed between adjacent diffusion regions in the substrate and each of the plurality of bit lines having bit line sidewall spacers formed on sidewalls thereof;
    an upper interlayer dielectric (ILD) layer on the plurality of bit lines and the lower layer;
    a pair of buried contact pads between adjacent bit lines and within the upper ILD layer, each of the pair of buried contact pads being aligned with one of the pair of exposed diffusion regions in the substrate; and
    a pair of capacitors, each of the pair of buried contact pads having one of the pair of capacitors thereon,
    wherein a pair of the plurality of the bit line sidewall spacers is adjacent to each of the buried contact pads and respective bit line sidewall spacers of each of the pairs of the plurality of the bit line sidewall spacers have an asymmetrical shape relative to each other.

2. The self-aligned buried contact pair as claimed in claim 1, wherein each of the bit lines comprises:
    a bit line barrier metal on the lower layer;
    a WSi layer on the bit line barrier metal; and
    a bit line mask on the WSi layer.

3. The self-aligned buried contact pair as claimed in claim 1, wherein the pair of buried contact pads is formed of polysilicon or tungsten (W).

4. The self-aligned buried contact pair as claimed in claim 1,
    wherein the pair of buried contact pads is a pair of first buried contact pads and the lower layer is a lower ILD layer, and the self-aligned buried contact pair further comprises:
    an intermediate ILD layer formed on the pair of first buried contact pads and the lower ILD layer, wherein the plurality of bit lines is on the intermediate ILD layer, and the upper ILD layer is on the intermediate ILD layer, the plurality of bit lines, and the bit line sidewall spacers; and
    a pair of second buried contact pads, each one of the pair of second buried contact pads being on one of the first buried contact pads and extending through the intermediate and upper ILD layers,
    wherein each of the pair of second buried contact pads has one of the pair of capacitors thereon.

5. The self-aligned buried contact pair as claimed in claim 4, wherein the pair of second buried contact pads is formed of polysilicon or tungsten (W).

6. The self-aligned buried contact pair as claimed in claim 4, wherein each of the bit lines comprises:
    a bit line barrier metal on the intermediate ILD layer;
    a WSi layer on the bit line barrier metal; and
    a bit line mask on the WSi layer.

7. The self-aligned buried contact pair as claimed in claim 1, wherein the lower layer is an oxide layer.

8. A self-aligned buried contact pair, comprising:
- a substrate having a plurality of diffusion regions;
- a lower ILD layer on the substrate, the lower ILD layer exposing a pair of the plurality of diffusion regions in the substrate;
- a plurality of bit lines on the lower ILD layer, each of the plurality of bit lines between adjacent diffusion regions in the substrate and each of the plurality of bit lines having bit line sidewall spacers on sidewalls thereof;
- an upper interlayer dielectric (ILD) layer on the plurality of bit lines and the lower ILD layer;
- a pair of first buried contact pads between adjacent bit lines and within the upper ILD layer, each of the pair of first buried contact pads being aligned with one of the pair of exposed diffusion regions in the substrate;
- an intermediate ILD layer on the pair of first buried contact pads and the lower ILD layer, wherein the plurality of bit lines is on the intermediate ILD layer, and the upper ILD layer is on the intermediate ILD layer, the plurality of bit lines, and the bit line sidewall spacers;
- a pair of second buried contact pads, each one of the pair of second buried contact pads being on one of the first buried contact pads and extending through the intermediate and upper ILD layers;
- a pair of capacitors, each of the pair of second buried contact pads having one of the pair of capacitors thereon;
- a first direct contact pad within the lower ILD layer adjacent the pair of adjacent diffusion regions; and
- a second direct contact pad within the intermediate ILD layer, the second direct contact pad being aligned with the first direct contact pad.

9. The self-aligned buried contact pair as claimed in claim 8, wherein the second direct contact pad is polysilicon or a metal.

10. The self-aligned buried contact pair as claimed in claim 9, wherein the metal is tungsten (W).

11. The self-aligned buried contact pair as claimed in claim 8, wherein the second buried contact pad is polysilicon or tungsten (W).

12. The self-aligned buried contact pair as claimed in claim 8, wherein each of the bit lines comprises:
- a bit line barrier metal on the intermediate ILD layer;
- a WSi layer on the bit line barrier metal; and
- a bit line mask on the WSi layer.

13. The self-aligned buried contact pair as claimed in claim 8, wherein a pair of the plurality of bit line sidewall spacers is adjacent to each of the second buried contact pads and the pair of bit line sidewall spacers has an asymmetrical shape.

14. The self-aligned buried contact pair as claimed in claim 8, wherein the second direct contact pad is over the first direct contact pad.

15. The self-aligned buried contact pair as claimed in claim 8, wherein a pair of the plurality of bit line sidewall spacers is adjacent to each of the second buried contact pads and respective bit line sidewall spacers of each of the pairs of the plurality of bit line sidewall spacers have an asymmetrical shape relative to each other.

* * * * *